United States Patent [19]
Joshi et al.

[11] Patent Number: 5,635,338
[45] Date of Patent: *Jun. 3, 1997

[54] ENERGY SENSITIVE MATERIALS AND METHODS FOR THEIR USE

[75] Inventors: Ajey M. Joshi, Santa Clara, Calif.; Timothy W. Weidman, Maplewood, N.J.

[73] Assignee: Lucent Technologies Inc., Murray Hill, N.J.

[*] Notice: The term of this patent shall not extend beyond the expiration date of Pat. No. 5,439,780.

[21] Appl. No.: 201,823

[22] Filed: Feb. 25, 1994

Related U.S. Application Data

[63] Continuation-in-part of Ser. No. 875,851, Apr. 29, 1992, Pat. No. 5,439,780.
[51] Int. Cl.$^6$ .................................................. G03F 7/00
[52] U.S. Cl. ........................... 430/325; 430/322; 216/49; 438/948
[58] Field of Search ........................ 430/270, 311, 430/313, 322, 323, 325, 326, 330; 156/643.1

[56] References Cited

U.S. PATENT DOCUMENTS 4,283,482  8/1981  Hattori ................................. 430/296

FOREIGN PATENT DOCUMENTS

| 0 382-932 | 8/1990 | European Pat. Off. . |
| 0 568 235 | 11/1993 | European Pat. Off. . |
| WO-A-89 07285 | 8/1989 | WIPO . |

OTHER PUBLICATIONS

Horn, "Plasma–deposited Organosilicon Thin Films as Dry Resists for Deep Ultraviolet Lithography", *J. Vac. Sci. Technol.B* 8(6), Nov./Dec. 1990, pp. 1493–1496.

*Primary Examiner*—Kathleen Duda
*Attorney, Agent, or Firm*—Richard J. Botos

[57] ABSTRACT

A class of silicon-containing materials display excellent sensitively in the ultraviolet and deep ultraviolet for the formation of patterns by radiation induced conversion into glassy compounds. Materials are depositable from the vapor phase and show excellent promise for use such as resists in the fabrication of electronic and optical devices.

23 Claims, 2 Drawing Sheets

ENERGY SENSITIVE MATERIALS AND METHODS FOR THEIR USE

CROSS-REFERENCE TO RELATED APPLICATION

This application is a continuation-in-part of U.S. patent application Ser. No. 07/875,851, filed Apr. 24, 1991, now U.S. Pat. No. 5,439,780, which is hereby incorporated by reference.

BACKGROUND OF THE INVENTION

1. Field of the Invention

This invention relates to photosensitive materials and, in particular, to photosensitive materials including silicon atoms.

2. Art Background

Photosensitivity has been found in polymers having an all silicon backbone such as in A) linear poly (diorganosilylenes), sometimes called polysilylenes or polysilanes, i.e., materials having the general formula $[R^1R^2Si]_n$ with $R^1$ and $R^2$ being various alkyl or aryl substituents and having n typically larger than 20, and B) in polysilyne network materials, i.e., materials having at least 70% of their silicon atoms bound to only one organic substituent and to three other silicon atoms.

Irradiation of linear polysilylenes with UV or deep UV light generally causes fragmentation that results after development in positive images—the unexposed regions remain after development. The photoreactivity of polysilynes is markedly different from that of polysilylenes. The polysilyne layer is exposed to ultraviolet light in the presence of oxygen to induce photooxidation with formation of crosslinked Si—O—Si networks. Such photooxidation produces a change both in solubility and in the refractive index of the oxidized relative to the unoxidized regions. The photooxidation allows selective removal by suitable solvents or halogen-based plasma reactive ion etching of the unexposed region to produce a negative image. Appropriate use of the refractive index change (if oxidized material is not removed) yields light guiding structures. Thus, photooxidation processes in polysilynes are suitable for fabrication of optical and electronic devices. (See U.S. Pat. No. 4,921,321, dated May 1, 1991.)

Soluble organosilicon films of partially characterized structure (reported in M. W. Horn et al, *Journal of Vacuum Science and Technology*, B8, 1493 (1990), to contain substantial Si—C—Si backbone bonds and an insignificant presence of Si—(Si)—Si bonds) have been deposited by plasma reaction of various volatile organosilicon compounds such as tetramethylsilane. These materials show a decrease in solubility and increased resistance to gaseous HBr or chlorine plasma etching after exposure to light at 193 nm with sensitivities of approximately 50 mJcm$^{-2}$, but are essentially transparent and not useful at longer wavelengths such as at 248 nm. For many processes such as the formation of electronic and optical devices, photosensitive materials (denominated resists) having a photosensitivity better than 200 mJcm$^{-2}$ and preferably better than 100 mJcm$^{-2}$ at or above 248 nm are required to avoid undesirably long exposure times. (Photosensitivity is defined as exposure dose required to allow the development of an imaged film capable of functioning as an effective etch mask for subsequent pattern transfer by reactive ion etching.) Furthermore, photosensitive materials requiring 193 nm light involve processing complexities which make it currently impractical.

Soluble polymeric methylhydridosilylenes have also been prepared (see, for example, U.S. Pat. No. 4,537,942, dated August, 1985, D. Seyferth and H. Lang, *Organometallics*, 10, 537 (1991), J. F. Harrod, "Inorganic and Organometallic Polymers") and in U.S. Pat. Nos. 4,719,273 and 4,537,942 their use, without further explanation, for photolithography, is suggested. No comment on properties indicating suitability for resist applications was provided beyond the basic suggestion that the materials are soluble in common solvents. In this regard, the use of a resist generally depends on solubility characteristic allowing deposition of solid films from solution by spin casting or spraying and allowing the solvent to evaporate. However, it has long been a goal to form a suitable resist on a substrate by deposition from the gas phase, useful for conventional deep to mid-UV photolithography (for example, at 248, 310, or 365 nm). Such gas phase deposition is advantageous since resist formation, exposure, development, and pattern transfer would become possible within an interconnected series of chambers (sometimes called a cluster tool) without degradation resulting from exposing the wafer to the ambient.

A suitable resist useful as a photodefinable glasslike reactive ion etch mask based on silicon chemistry having acceptable sensitivities at wavelengths longer than 200 nm that is capable of being deposited from the gas phase is not presently available.

SUMMARY OF THE INVENTION

Silicon polymers deposited from the gas phase such as those represented by the formula $R_xSiH_y$, with R being an organic moiety and with $0.2<x<1.5$ and $0.2<y<1.5$, have been found to exhibit quite advantageous properties for lithographic processes. Particularly advantageous polymers are prepared by discharge deposition from the vapor phase using, for example, RSiH$_3$ precursors, e.g., methylsilane, ethylsilane or phenylsilane, to give polymers having substantial Si—(Si)$_n$—Si bonded networks.

Materials produced by plasma deposition are typically insoluble (solubility less than 20% of original weight in toluene) and, nevertheless, lend themselves to patterning and development without use of liquid processing, and, if desired, are suitable for a cluster or highly integrated processing environment. These polymers are capable of photooxidative patterning with sensitivities as good as 15 mJcm$^{-2}$ (at 248 nm), allow resolution of dimensions at least as small as 0.25 μm, and, for many processes, allow pattern development and subsequent dry etching of the underlying substrate in a single reactive ion etch sequence. Compositionally similar materials prepared by reductive condensation processes in the liquid phase from an RSi HX$_2$ (X=halogen) precursor, although not as advantageous, also offer desirable properties.

The polymers involved in the invention, which are believed to contain primarily silylene (RSiH) segments and silyne (RSi) branch points (R exemplified by alkyl, aryl and/or H), are sensitive to light in the ultraviolet and deep ultraviolet in the presence of an oxidant, e.g. oxygen, as well as to particle radiation such as electron beam radiation in vacuum or in the presence of an oxidant. Irradiation of the materials in the presence of oxygen with energy such as in the ultraviolet, e.g., 200 to 400 nm, causes formation of glassy, siloxane network materials in the irradiated regions. In negative tone mode, the unoxidized regions are advantageously removed to develop the pattern using dry halogen based reactive ion etch (RIE) processing conditions similar to those used to preferentially etch silicon relative to SiO$_2$.

Films deposited from precursors such as MeSiH$_3$ and EtSiH$_3$, are made similar in etch resistance to SiO$_2$ by photo-oxidative exposure and the pattern is developed and transferred in one step. Thus, development of the pattern, for example, using a halogen-based plasma etchant such as Cl$_2$ RIE, also allows subsequent etching with the same etching plasma of an underlying material such as polysilicon or aluminum. By changing etchant gas after development, materials such as organic polymers, III–V materials such as GaAs, InP, or their alloys, and aluminum as well as its alloys, are also patternable in the same processing step (i.e., without removal from an RIE apparatus).

DETAILED DESCRIPTION

Figure 1:
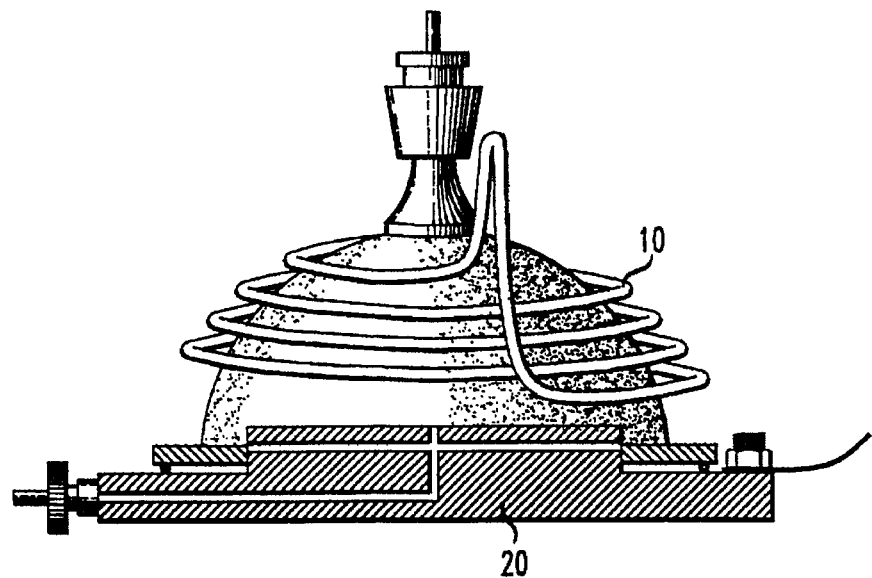
FIGS. 1 and 2 are illustrative of apparatuses useful in practicing this invention.

A class of photosensitive materials involved in the invention is represented by the formula:

$$R_x SiH_y \text{ with } 0.2<x<1.5 \text{ and } 0.2<y<1.5 \qquad (1)$$

where R is an organic substituent (small quantities of a non-organic R are not precluded). Suitable organic substituents include alkyls, such as lower alkyls (alkyls having 1 to 10 carbon atoms), aromatic moieties, such as phenyl, and other organic substituents such that the deposition precursors containing these substituents have a sufficient vapor pressure (or partial pressure when using a carrier gas) to allow useful deposition rates (deposition of at least 10 Å/min).

The particular organic substituent chosen depends on the ultimate properties desired for the silicon containing photosensitive composition. Typically, smaller substituents yield upon photooxidation material exhibiting a greater increase in etch resistance in etchants such as chlorine based plasmas relative to unexposed material. Aromatic substituents such as phenyl while having lower etch selectivity between exposed and unexposed regions in such etchants, generally yield material of greater thermal and oxidative stability.

It is possible to synthesize and deposit the materials involved in the invention through a variety of techniques. For example, precursors represented by the formulae:

$$RSiH_3 \text{ and/or } R_2SiH_2$$

where R is as defined supra are subjected to a low energy discharge. (A combination of precursor gases is also useful.) It is also possible to add in small quantities other gases such as silane to influence properties such as the absorption characteristics or film density. For dry deposition, the discharge is typically excited by radiation in the range 500 KHz to 30 MHz. However, other discharges, such as D.C. discharges, are also suitable. Additionally, discharges such as microwave discharges generating reactive species in a region remote from the precursor and which subsequently react with the precursor are not precluded. Suitable energies depend, to an extent, on the precursor materials and processes, but generally discharges having unconventionally low energy densities in the range 2×10$^{-3}$ to 0.2 Wcm$^{-2}$ of substrate are employed. Generally, the discharge conditions are adjusted so that a faint but stable glow (in the pure precursor or carrier gas and precursor combination) is visually observable adjacent to the substrate in a darkened room. The exposure and processing characteristics of gas phase deposited films degrade somewhat upon exposure to oxidant or adventitious light. This instability is mitigated by using higher plasma energy densities or elevated substrate temperatures but lower exposure sensitivities result. To obtain films of highest sensitivity and achieve fastest deposition rates, it is preferable to maintain the substrate 5°–30° C. below the ambient temperature of the chamber walls of the apparatus. In contrast, plasma depositions are normally done under conditions that heat the substrate above the ambient.

Vapors of liquid precursor materials are introduced into the region of the substrate generally through use of a carrier gas. Typically, a carrier gas such as hydrogen is bubbled through the precursor material for such introduction. Generally, the partial pressure of the precursor is such as to result in a concentration of at least 2 mole % of the carrier gas. Use of hydrogen as a carrier gas is advantageous since it promotes a stable discharge and yields more uniform films. Typically, flow rates of the carrier/precursor combination in the range 5 to 200 sccm per liter of reaction volume are employed. A control sample is employed to empirically establish precise flow rates, pressures, power levels, and deposition times to achieve the desired uniformity, absorption properties and photosensitivity for a given reactor geometry.

The discharge is generally struck in the precursor/carrier combination in a parallel plate reactor as described in *Plasma Deposition, Treatment and Etching of Polymers*, R. D'Agostino, Ed., Academic Press, N.Y., 1990, where the precursor is introduced through, for example, multiple openings in the upper powered electrode, or in a reactor such as the one shown in FIG. 1, where the energy (typically between 10 mWcm$^{-2}$ and 100 mWcm$^{-2}$) is coupled to the plasma through external copper coil, 10, and the gas is introduced at 20. Generally, to avoid deposition of particles it is advantageous to maintain pressures below 500 mTorr and to limit residence time of reactants in a plasma column. Deposition rates are generally in the range 50 to 500 Å/min. Film thicknesses are typically in the range 200 to 20,000 Å (preferably 500 to 5000 Å). Deposition is terminated simply by extinguishing the discharge.

Another method for producing soluble materials within the class of equation 1 is by a reductive condensation process. The resulting materials are soluble in common solvents and it is possible to apply them by conventional spin-coating techniques. However, such materials are generally less desirable than the dry deposited material because of difficulties related to the instability of the solutions, to impurities (particularly NaCl and KCl byproducts) and to reproducibility difficulties. However, both the solution and dry deposited materials are advantageous because they make possible subsequent processing involving dry reactive ion etching in which development and pattern transfer are achieved in a single dry processing sequence.

Such wet synthesis involves the step of using a precursor material of the formula:

$$RSiHX_2$$

where X is halogen and R is as defined supra for materials formed by plasma synthesis. The technique employed is basically that described in U.S. Pat. No. 4,921,321, dated May 1, 1991, to promote formation of soluble yet more stable materials useful with liquid or dry (e.g., plasma RIE) developed resist. Precursors are dissolved in a solvent such as toluene, and subjected to a reagent such as NaK. For lower alkyl precursors, lower temperatures (under 50° C.)

are used to avoid loss of the volatile monomer, and sonication is used to promote the reaction. The resulting materials are separated from byproducts such as sodium chloride and potassium chloride by filtration, and are generally soluble in solvents such as aromatic hydrocarbons. By forming a suitable solution and by employing conventional techniques, such as spin coating, a layer of the photosensitive material is easily produced on a device substrate such as a substrate to be formed into an electronic or optical device.

The materials of the invention are patterned or blanket converted into a glassy material by subjecting them to an oxidant such as molecular oxygen, in the presence of exposing radiation. (Exposing radiation includes radiation such as vacuum ultraviolet, deep ultraviolet, and ultraviolet as well as particulate energy such as an electron beam.) It is desirable to prevent contact of the resist films with air until between 1 minute and an hour before exposure. Excessive pre-exposure contact with oxidants reduces pattern development selectivity while a brief pre-exposure contact insures sufficient availability of oxidant. The use of endpoint detection applied to plasma development allows relatively larger latitudes in pre and post-exposure contact with oxidant. Total pre and post-exposure contact with oxidant should generally be less than 1 hour but less contact generally is desirable. Oxidants such as oxygen containing gases including air at ambient pressure are useful. It is contemplated that deposition at low power densities and at temperatures around room temperature produces films of low density with high permeability to, and reactivity with, oxygen. Such films contain extensive Si—Si bonding and retain reactive SiH moieties that together yield efficient photooxidation processes. Through introduction of oxidant in the presence of radiation, materials containing Si—O—Si species and Si—OH species are obtained in the irradiated area. (It is possible to irradiate in a pattern or alternatively to irradiate the entire material to form an organosilicon oxide glass. Additionally, for some applications it is advantageous to deposit an underlying layer of amorphous silicon since this underlying layer is highly absorbing for typical exposing radiation and acts as an antireflection coating. The same plasma used for negative tone development transfers the pattern through the underlying amorphous silicon. Organic plasma polymerized antireflective coating are also useful. Such coating is obtained by striking a plasma in an organic gas such as a volatile unsaturated hydrocarbon gas e.g., cycloheptatriene. Use of this plasma deposited antireflection coating allows an all dry process and provides a better etch stop for the development of the overlying resist. The use of conventional organic antireflection coatings, however, is not precluded.) An advantage of gas phase deposition of radiation sensitive layers is the avoidance of solvent attack on the underlying layer, which can be a readily soluble material.

The pattern formed by irradiation is developed by subjecting the film to a developer that preferentially removes either the unexposed regions or the exposed regions at a rate substantially, e.g. at least 1.5 times, faster than it removes the exposed regions or unexposed regions, respectively. A developer that removes the exposed region yields a positive image, while one that removes the unexposed region yields a negative image. For a negative image, and for materials deposited from the plasma, typical developers include entities formed by striking a discharge, e.g. a plasma, in halogen containing gases such as molecular chlorine or bromine or HBr. (Such discharges are described in compendia such as *Plasma Etching; An Introduction,* D. M. Manos and D. L. Flamm, Eds., Academic Press, N.Y., 1989). For a negative image using films deposited from solution, development is also performed by dissolution of unexposed material in solvents such as aromatic hydrocarbon solvents.

Wet etchants are useful for developing positive images. For example, an aqueous solution of ammonium fluoride and hydrogen fluoride is used. Generally, a buffered oxide etchant solution having approximately 7:1 by volume of saturated aqueous ammonium fluoride solution to saturated aqueous HF solution is employed. Use of this etchant yields a selectivity of approximately 10:1 for positive image formation. Similarly, an ethylene glycol or propylene glycol solution using three parts of the above described aqueous ammonium/fluoride HF solution with 8 parts of ethylene or propylene glycol yields a 5:1 selectivity for positive image formation. It should, however, be noted that some commercial buffered oxide etchants also contain surfactants, and such suffactants typically tend to induce delamination of the photosensitive film or lower selectivity and should generally be avoided. For positive tone development, the higher the ionic content of the solution, the less tendency of the etchant to wet the unexposed region and, therefore, the higher the selectivity during etching. Thus, solutions with a higher ionic concentration are favored.

For a positive image, certain deposition criteria should be modified relative to the formation of a negative image. In particular, deposition, as described above, for thicknesses greater than 0.25 µm tends to induce delamination during subsequent positive image development. Thus, if greater thicknesses are desired, the deposition process should be advantageously modified. Indeed, thicknesses as large as 2 µm are obtainable without delamination during development by adding hydrogen to the organosilane precursor during deposition. Typically, the mole fraction of hydrogen to the precursor in the gas stream should be in the range of between 5 and 50% for lower alkylsilanes and higher mole fractions for others.

Although films up to 2µ in thickness are obtainable without delamination, such films are optically dense in the UV region used for exposure and, thus, are generally not most advantageous for integrated circuit applications. For other applications, it is possible to contemplate use of such thick layers. It is also possible in the absence of hydrogen addition to obtain thicker films which do not delaminate by employing a ground screen inserted between the powered electrode and the substrate. (Such configuration is often called, in the trade, a remote plasma assisted deposition configuration.) Additionally, plasma deposition as described previously on a substrate placed on the powered electrode of a plasma discharge apparatus yields denser and more robust materials than when placed on the unpowered electrode. Although materials deposited on either powered or grounded electrodes are useful, and the same materials used for negative tone are useful for positive tone, materials deposited on the powered electrode typically require higher exposure doses and leave more residue after wet positive tone development. Films deposited using hydrogen diluted methylsilane tend to be less stable to storage in air, but undergo more complete and uniform photooxidation throughout the thickness of the film, leaving behind less residue following wet positive tone development.

This residue tends to resist etching of the underlying layer and, in particular, in a bilevel configuration, substantially reduces the ability to transfer the pattern into the underlying organic planarizing material of the mask structure. The residue is either prevented by including hydrogen in the discharge, as described earlier, in the context of avoiding delamination or by subsequent removal using conventional descumming procedures. In particular, before residue removal, it is desirable to perform a blanket exposure in the presence of oxygen in order to convert the deposited material to the corresponding oxide. A nonselective etch for oxide is then employed. This etch, such as a sulfur hexafluoride/oxygen mixture, or a $CF_4/O_2$ mixture removes the residue as well as an unimportant equivalent thickness from the unexposed areas.

A positive tone image is also obtainable through use of completely dry plasma techniques. In particular, dry development in such processes depends on using an etching plasma that has sufficient selectivity between silicon oxide and silicon. For films formed from a phenylsilane precursor, such selectivity is relatively easily achieved. For example, a plasma containing 25 mole % oxygen in $CHF_3$ yields adequate selectivities (between 2:1 and 3:1) for removal of exposed areas of the film. For an all-dry development process employing a phenylsilane precursor, it is generally desirable to limit the film thickness to 0.5 μm since greater thicknesses tend to result in excessive exposure times. Similar selectivities are required for films deposited from other precursors such as alkylsilane precursors. A suitable etchant having appropriate selectivities should be employed in this latter situation. Etching conditions yielding high selectivity between silicon oxide and silicon are well known and described in the literature.

After negative or positive pattern formation, it is desirable for many applications, as further discussed, to convert the developed image to a more completely oxidized form. This conversion is accomplished, for example, by blanket exposing in the presence of oxygen and then, in one embodiment, subjecting the blanket exposed pattern to reactive entities from an oxygen plasma. Such treatment is typically performed at oxygen pressures between 0.5 to 2.5 Torr and temperatures between 150° to 250° C., using an apparatus in which either RF or microwave energy is used to create reactive oxygen species including ozone which are passed through a ground screen and reacted with the substrate downstream from the plasma. Other means of generating reactive oxygen entities are also useful. Alternatively, the blanket exposed region is heat treated in oxygen by ramping the temperature at a rate between 5° and 25° C./min to a temperature of approximately 400° C. and maintaining this temperature for a period in the range 10 to 60 minutes. It is also possible to first subject the material to the oxygen plasma described above. For films produced from methyl and ethylsilane, Rutherford backscattering indicates that the resulting oxide has the same composition as silicon dioxide. Thus, such patterned oxide is advantageously useful as structures in integrated circuits and optical devices where silicon dioxide is normally employed. Indeed, in general, the oxidized material is used as a region in the device or is utilized as a mask for subsequent processing, e.g. etching of the underlying device regions. Typical etching processes are described in *Plasma Deposition, Treatment and Etching of Polymers*, R. D'Agostino, Ed., Academic Press, N.Y., 1990.

For some applications it is also possible to include additional step(s) between the development of the patterned resist and the subsequent pattern transfer to the underlayer. Such additional steps are exemplified by a) a blanket deep UV exposure in air of the developed resist mask, b) subjecting the developed resist mask to a brief $O_2$—plasma treatment or c) a combination of a) and b), to increase the overall oxygen content of the resist mask beyond that achieved in the initial photooxidative patterning step with a concomitant improved/increased selectivity during the RIE pattern transfer step.

The developed resist is used for further processing, e.g. as an etch mask for plasma etching of the underlying material.

Etching processes are well-known and described in compendia such as R. D'Agostino supra. Generally, the higher the silicon weight percentage in the material before exposure the greater the selectivity in the pattern transfer step into the underlying organic layer. To increase silicon content it is advantageous to use smaller substituents, such as ethyl and methyl.

The following examples are illustrative of methods for depositing silicon containing photosensitive materials and for exposing and processing such materials.

EXAMPLE 1

A simple apparatus useful for the dry deposition of [RSiH] hydrogenated organosilicon films is illustrated in FIG. 1. The apparatus was constructed from a 10"×¾" thick aluminum baseplate with a central 4" diameter platform elevated ¼" (the remainder of an initially 1" thick plate was removed by machining) tapped to allow attachment to a vacuum pump and pressure gauge. Into the top elevated portion of the platform were cut 8 radial channels, ⅛" thick and ⅛" deep, symmetrically distributed every 45° around its circumference, and joining the central ⅜" vacuum opening. A shallow glass bell jar enclosure with an ID of approximately 7" and height of about 4" was placed over the base and formed a vacuum tight seal with an O-ring. Coiled around the enclosure and terminating about 2" from the baseplate was a copper coil consisting of about 4 turns of a ⅛" ID copper tube, following loosely the contour of the vessel but ending 2" short of the metal baseplate at its nearest point. The apparatus was placed in an inert atmosphere (argon) glovebox. A plasma was struck in the apparatus by connecting the copper coil to a high frequency spark generator operating at 4.5 MHz (Electro-Technique Products Model BD 20). All Examples were conducted at pressures ranging from 400 to 600 mTorr as read from a thermocouple vacuum gauge inserted into the aluminum base plate.

A flat, polished silicon substrate of 5 inch diameter, having the (100) crystallographic plane as its major surface, was placed on the platform, and the system was evacuated to a base pressure below 40 mTorr. (Quartz substrates were also used to measure the optical properties of films.) As indicated below in Table 1, depositions were conducted using, individually, a number of $RSiH_3$ precursors or individually dimethylsilane and tetramethylsilane, each of which was introduced through the glass diffuser inlet at the top of the enclosure. The voltage was adjusted to create a weak, stable discharge visually perceivable in a darkened room, confined to, and completely filling the enclosure above the wafer. The optical densities of the resulting films for the precursors employed are shown in Table 1.

TABLE 1

Precursors and Optical Densities of Resulting Films:

| Precursor | $Absorbance_{248\ nm}/1000Å$ ±0.1 |
|---|---|
| $CH_3SiH_3$ methylsilane | 0.60 |
| $C_2H_5SiH_3$ ethylsilane | 0.70 |
| $n-C_6H_{13}SiH_3$ n-hexylsilane | 0.20 |
| $C_6H_5SiH_3$ phenylsilane | 0.35 |
| $(CH_3)_2SiH_2$ dimethylsilane | 0.30 |

Flow rates of undiluted gaseous precursor averaged between 8 and 12 sccm (based on the measured consumption of the precursors after extended deposition runs) with the vacuum valve completely open. Flow was adjusted by using a metering valve on the inlet line. (Silane oligomers condense in vacuum pump oil and can give rise to explosive mixtures, particularly if moisture is present. Careful precautions must be taken to avoid this situation.) For liquid precursors, the hydrogen gas (typically at about 2 psig) was redirected through the vessel containing the precursor. The precursor gas was delivered until a film thickness of 1000±100 Å was achieved. The resulting film was protected from light and air by storage in a glovebox under flowing nitrogen until 10 minutes before lithographic exposure. It was exposed to the ambient under clean room illumination and patterned in a GCA 2000 KrF excimer laser stepper system operating at 248 nm). The lithographic exposure was done at doses varying from 50 to 290 mJcm$^{-2}$ by steps of 10 mJcm$^{-2}$. Oxidation was generally accompanied by a roughly 100 Å (about 10%) increase in film thickness. Both development and pattern transfer into an underlying thick layer of hard-baked Hunt Photo Resist-206 were accomplished using a helical resonator reactive ion etching (RIE) system without removing the sample from the etch chamber.

Films (about 1000 Å) were deposited from ethylsilane on top of 8000 Å of hard-baked photoresist. Exposure was accomplished as described above. The RIE development conditions are listed below in Table 2 and are similar to those typically of use for the selective etching of silicon over silicon dioxide, while those for O$_2$ are typical for the removal of organic resist materials.

TABLE 2

| Pressure, mTorr | Flow, sccm | Bias, volts | Time, s |
| --- | --- | --- | --- |
| Cl$_2$ (1850–150 watts) 1.25 | 35 | −20 | 25 |
| O$_2$ (2000–150 watts) 1.60 | 50 | −190 | 45 |

Scanning electron micrographs (SEM's) were obtained on patterns exposed with 120 and 170 mJcm$^{-2}$ total dose. The lines and spaces greater than or equal to 0.3 μm were intact for exposure doses equal to or greater than 120 mJcm$^{-2}$, with 80° side walls, low linewidth loss and no undercutting.

EXAMPLE 2

A liquid phase synthesis of material characterized as [MeSiH$_x$]$_n$ with x~0.5 was performed in anhydrous grade solvents in an inert atmosphere glovebox equipped with a 375 watt, 20 kHz ultrasonic immersion horn. Liquid (1:1 mole ratio) Na/K alloy was prepared in the glovebox by adding potassium to an equimolar amount of molten sodium. Synthesis of poly(methylhydridosilylene-co-methylsilyne), [(MeHSi)$_x$(MeSi)$_{1-x}$]$_n$, [1]

A toluene solution (150 mL) of methyldichlorosilane, MeHSiCl$_2$, (23.0 g, 200 mmol) was placed in a jacketed beaker and cooled to 10° C. with a circulating cooling bath. The solution was irradiated ultrasonically and Na/K alloy (12.4 g, 200 mmol) was added dropwise over approximately 15 minutes. After 30 minutes of sonication, tetrahydrofuran (80 mL) was added to the thick suspension to promote further reaction, and the sonication continued for an additional two hours while the temperature of the reaction mixture remained between 45°–55° C. The suspension was stirred for 16 h at room temperature and then titrated carefully with methyldichlorosilane with sonication until a 0.5 mL aliquot that was removed from the glovebox and hydrolyzed with water gave a pH value of 6–7.

The mixture was diluted to 300 mL with toluene and filtered inside the glovebox through a Schlenk filter to give a clear yellow solution. The filtrate was concentrated to 50 mL, removed from the glovebox, and poured into 250 mL of vigorously stirred, deoxygenated methanol. The pale yellow solid that precipitated was separated by filtration, dried under a stream of purified nitrogen for 5 minutes, redissolved in minimum amount of tetrahydrofuran, precipitated from methanol, and dried again to yield 3.9 g (45%) of dry amorphous yellow polymer.

Various tests were performed on the resulting material. Solution NMR spectra were recorded on a Bruker AM-360 FT-NMR spectrometer (360 MHz for $^1$H, 90.56 MHz for MHz for $^{13}$C; 71.55 MHz for $^{29}$Si) in d$_6$-benzene solution at room temperature. Solution $^{29}$Si chemical shifts were referenced to external hexamethyldisiloxane in d$_6$-benzene solution (7.22 ppm). Electronic spectra were measured over the range 190–510 nm on an HP-8452 UV-visible diode array spectrophotometer. Infrared spectra were obtained on a BIO-RAD FTS-60 FTIR instrument. Mass spectra were obtained on an HP-5985B quadrupole mass spectrometer using a high temperature probe and a heating rate of 30° C. min.

X-ray fluorescence measurements on the solid samples were performed on an instrument equipped with a Cr tube and a Princeton Gamma Tech detector and computer. A Dektak 3030 profilometer was used for film thickness measurements. Refractive indices of films, were determined ellipsometrically at 632 nm using a Gaertner Scientific Ellipsometric analyzer. Photochemical exposures were performed using a 1000 W Oriel Hg-Xe exposure apparatus optimized for deep UV output around 265 nm. The light intensity at the sample surface averaged 20 mWcm$^{-2}$. Additionally, lithographic exposures to measure dose requirements were performed at 248 nm using a GCA KrF excimer laser stepper system and conventional integrated circuit resolution test masks.

X-ray fluorescence measurements on the resulting material showed less than 0.01 atom percent Cl relative to silicon. Solid samples exhibited an apparent tendency toward crosslinking which resulted in a substantially decreased solubility over a few days. To prevent this, the material was immediately redissolved in dry, degasseal toluene and stored under nitrogen in the dark, usually as an approximately 10% w/v solution. The solution was filtered through 0.45 μm membrane filters and spun onto a suitable substrate to yield clear solid films up to 4 μm thick. Characterization Data: NMR (C$_6$D$_6$, 20° C., ppm): $^1$H, δ=0.45 (br,—CH$_3$,6H), 4.0 (br, Si—H, 1H); $^{13}$C{$^1$H}δ=−9.5 (br,—CH$_3$); $^{29}$Si{$^1$H}δ=−45,−75.7,−78.5 and −82 (all br). Based on the $^1$H NMR relative integral intensities of the methyl and the hydride peaks, this material is characterized as a copolymer of methylhydridosilylene (MeHSi;) and methylsilyne (MeSi—) units: [(MeHSi)$_x$(MeSi)$_{1-x}$], where x is approximately 0.5. IR (neat film on KB$_r$,cm$^{-1}$): 2955(s), 2890(s), 2103(vs,br), 1408(m), 1246(s), 1057(vs, br), 930(w), 867 (vs), 764(vs), 683(s). The UV-visible spectrum of [1] (neat film on quartz) shows an absorption band edge tailing into the visible region, ε,μm$^{-1}$ (λ,nm): 6.7(248), 6.1(254), 5.1 (265), 4.1(280), 2.8(310), 0.12(365). MS (T$_{dec}$ onset at 300° C.), m/e: 44 (CH$_3$SiH or CH$_2$=SiH$_2$). Refractive index: 1.83±0.03.

EXAMPLE 3

A solution of the material prepared as described in Example 2 was spin-coated onto a 5" substrate at 2000 rpm to give a 0.2 μm thick film. The substrate had been previously treated by spin coating with an organic planarizing layer (4 μm of the commercially available resin Hunt Photo Resist 206 that was then baked at 200° C. for 30 min.). Patterning was performed using a GCA Model 2000 Deep UV Stepper using a resolution mask with exposures between 20 and 200 mJcm$^{-2}$. Development by immersion in toluene for 30 seconds resulted in the dissolution of the unexposed regions leaving the oxidized portions. Pattern transfer to the underlying Hunt Photo Resist-206 organic layer was achieved by oxygen reactive ion etching (O$_2$—RIE) using a 13.65 MHz generator, a bias of −375V, and a power density of 0.20 Wcm$^{-2}$ with a selectivity better than 100:1.

EXAMPLE 4

The procedure of Example 3 was followed, except the silicon containing layer was about 0.35 µm thick and overlaid a 1.4 µm thick layer of Hunt Photo Resist-206. Development was accomplished either by using a Cl$_2$ plasma: 1.25 mTorr; 13.65 MHz; 0.20 Wcm$^{-2}$ power density; −20V bias (5:1 selectivity at 100 mJcm$^{-2}$ exposure dose). Pattern transfer was achieved as described in Example 3. Exposure doses between 70 and 120 mJcm$^{-2}$ yielded resolutions of 0.35 µm for equal lines and spaces.

EXAMPLE 5

The procedure of Example 1 was followed except in place of the high frequency spark generator a variable frequency (0.5–35 MHz) rf source, consisting of a signal generator attached to an amplifier and a matching network equipped with powermeters for reading incident and reflected power, was employed to excite the plasma. The precursors listed in Table 1 were introduced into the chamber as received without dilution at flow rates of 12 sccm and at 500 mTorr pressure before igniting the plasma. The rf frequency generator was operated at 3.0 MHz with 3 W net absorbed rf power (15 mWcm$^{-2}$).

The gauge reading during depositions generally averaged between 50 and 300 mTorr higher than initial readings without the plasma. Substrate temperature was uncontrolled, but at no time did the baseplate temperature exceed 35° C. Films obtained from the various precursors were bleached by exposure to light at 254 nm, indicating photoinduced oxidation.

EXAMPLE 6

Low energy rf plasma assisted deposition of photosensitive silicon polymers, using the silane precursors of Example 1, was carried out in a PlasmaThermShuttleLock Series 700 plasma etch reactor operating at 13.56 MHz and equipped with an 11" diameter wafer tray which accommodated three 5" diameter wafers.

A silicon polymer film using ethylsilane as the precursor was deposited simultaneously on (A) a 5" (100) substrate (B) a 5" Si (100) wafer spin coated previously with a 1.0 µm thick hard baked Shipley resist 1811 and (C) a 5" Si (100) wafer spin coated with 2500 Å of a deep-UV antireflection coating (ARC), Brewer DUV-07, at ambient temperature over a 15 min period, at a nominal flow rate of 50 sccm, 200±10 mTorr pressure, 9±1W incident and 0–1W reflected rf power (power density about 15 mWcm$^{-2}$). A faint glow was visible during the course of the deposition. The refractive index and the thickness of the polymer film on the silicon substrate, as obtained from a nine-point measurement using a Nanometrics Nanoscope, averaged 1.79±0.03 and 1550±50 Å, respectively. The average film thickness value measured by a Dektak 3030 profilometer was in agreement with that obtained from the Nanoscope measurements.

A 4400±100 Å thick film also deposited from ethylsilane precursor was similarly deposited over 40 minutes on a 5" Si (100) substrate with a previously deposited 5000 Å polysilicon layer on 1000 Å SiO$_2$ (D).

The deposited films were removed from the reactor and stored under vacuum and protected from exposure to ambient light until a few minutes prior to patterning. Each of the three Test Samples A–C was patterned in air as described in Example 1 on a GCA Model 2000 Deep UV Stepper, operating at 248 nm, using a resolution mask with exposures in the 50 to 290 mJcm$^{-2}$ range (starting at 50 and increasing by 10 mJ increments; 5×5 matrix) at best focus. An approximately 150 Å thickness increase resulting from the oxidation was measured in the exposed regions (about 100 mJcm$^{-2}$). Test Sample D was patterned using the same exposure equipment and resolution mask with exposures ranging from 10 to 250 mJcm$^{31\ 2}$ (starting at 10 and increasing by 10 mJ increments; 5×5 matrix). In each case the latent images were visible through the entire exposure range.

Test Sample A was subjected to a partial, 40 s, Cl$_2$ reactive ion etch under conditions described in Example 1 in a 13.56 MHz ProioTech Research System 1800 apparatus incorporating an rf helical resonator plasma source and equipped with a laser interference measurement system for thickness loss monitoring. Remaining resist thickness (as determined using a depth profilometer) of the unexposed region was about 400 Å (unoptimized etch rate of about 1725 Å min$^{-1}$) while that in the exposed region varied between 790 and 1250 Å with increasing exposure dose (unoptimized etch rate about 1290 to 590 Å min$^{-1}$) yielding an unoptimized etch selectivity for unexposed relative to exposed regions of about 2:1 at 100 mJcm$^{-2}$ and about 3:1 at greater than 200 mJcm$^{-2}$ exposures.

The top, patterned silicon polymer layer of Test Samples B and C was similarly developed by a 55 s Cl$_2$ reactive ion etch (little or no overetch) under the same conditions. In each case, pattern transfer to the organic underlayer was achieved in the same reactor by switching the reactive ion etching gas to oxygen (25 sccm, 0.80 mTorr, 1800W incident, approximately 200W reflected power, −220±20V bias, back cooled with 35 sccm, 4.8 mTorr He, etch time: 90 s for Sample B and 60 s for Sample C (including approximately 10% overetch) yielding an etch selectivity for the organic underlayer relative to the resist of greater than 50:1. Examination of the resolution patterns (SEM) showed 0.3 µm lines and spaces intact.

For the test Sample D, development of the resist layer and pattern transfer to the polysilicon layer were accomplished in a single Cl$_2$ reactive ion etching step using the conditions described above, with 0.35 µm line and space resolution. The total etch time of 285 s included a 150 s resist etch and a 135 s polysilicon etch (etch rate for polysilicon 2250 Å/min, unoptimized etch selectivity versus the resist at 100 mJcm$^{-2}$ exposure of about 2.5:1).

EXAMPLE 7

A PlasmaLab diode reactor (ordinarily used for SiO$_2$ deposition) operating at 13.56 MHz was employed for plasma assisted deposition of organohydridosilicon films from phenylsilane precursor. A mixture of phenylsilane in hydrogen carrier gas, obtained by bubbling hydrogen (5 psi) through the liquid phenylsilane precursor, was introduced in the deposition chamber at a 80 sccm flow rate and 500±10 mTorr total pressure. The reactor was preconditioned at 150W incident power (less than 10W reflected; 750 mWcm$^{-2}$ power density) for 30 min. followed by 9W incident power for 30 min. to passivate the chamber surface. A 1500 Å thick phenylhydridosilicon film was deposited over 10 min at 6W incident power (less than 1W reflected, power density 32 mWcm$^{-2}$) at 45° C. substrate temperature on 2" diameter GaAs and 2" diameter InP wafer substrates. The test samples A and B were patterned in air at 310 nm on a Karl Suss exposure system operating in contact printing mode, using a standard line-and-space grating mask with 0.5 µm features (200 mJcm$^{-2}$ total exposure). Resist development and pattern transfer to the individual substrates were accomplished in a single reactive ion etch sequence in a PlasmaLab etch system without removing the substrate from the etch chamber using the conditions listed in Table 3 ($Cl_2$-RIE for development followed by $SiCl_4$-RIE and $CH_4$/$H_2$ plasma etch for pattern transfer into GaAs and InP, respectively).

One micron deep trenches were etched into the GaAs test sample after 10 min of $SiCl_4$-RIE, with selectivity (unoptimized) better than 10:1. A 30 min. $CH_4$/$H_2$ plasma etch of the InP test sample, similarly yielded 1.5 μm deep trenches into the InP substrate, with selectivity (unoptimized) greater than 5:1.

TABLE 3

| Substrate | Etchant | Flow, sccm | Pressure, mTorr | Power, $mWcm^2$ | Temp, °C. | Time, min |
|---|---|---|---|---|---|---|
| [$Ph_xSiH_y$] resist | $Cl_2$ | 10 | 5 | 80 | −10 | 14 |
| GaAs | $SiCl_4$ | 10 | 5 | 160 | −10 | 10 |
| InP | $CH_4$/$H_2$ | 1 20 | 15 | 290 | 80 | 30 |

Films deposited from methylsilane or ethylsilane, as described in Example 5, were exposed to 265 nm light in a contact printing mode. Development was performed as described in this Example. Pattern transfer selectivities greater than 20:1 were observed after the developed films were given a blanket exposure in air.

EXAMPLE 8

Figure 2:
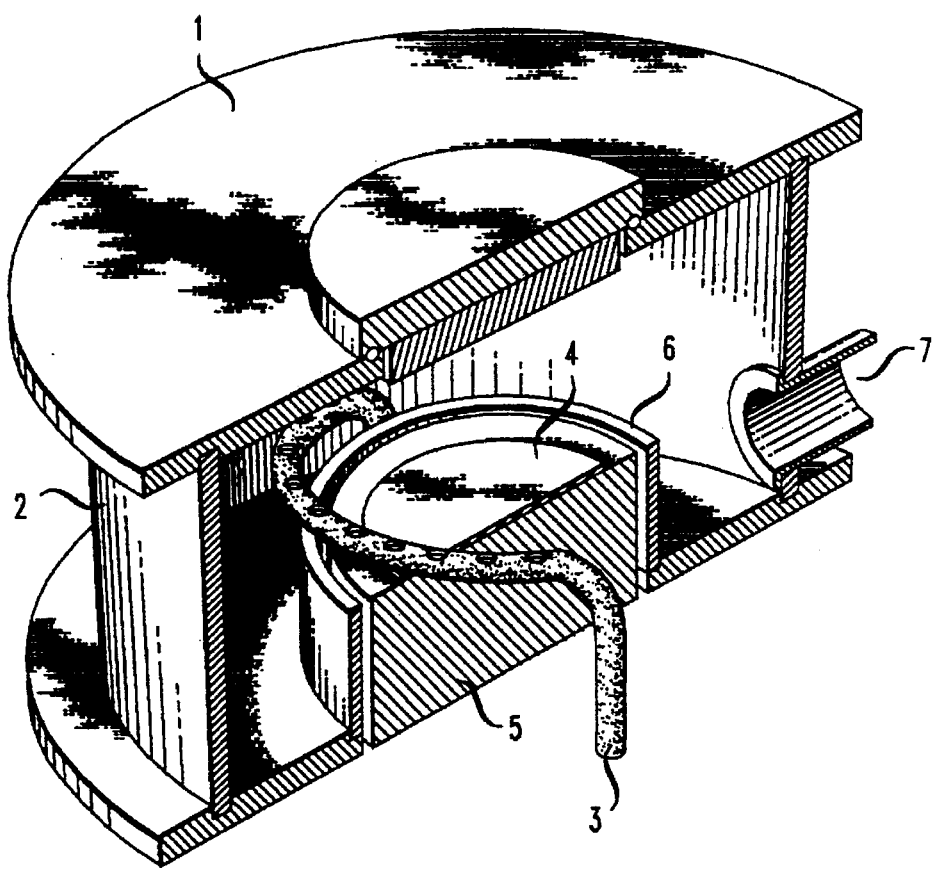

An RIE chamber was used and included a grounded aluminum chamber with a lower powered electrode, the center 4" of which extended through an insulating ½" thick ring (FIG. 2). A 13.56 MHz rf generator was tuned and adjusted to produce a faint but stable glow discharge in hydrogen with a total pressure of 100 mTorr confined to the region just above the powered electrode.

Photosensitive amorphous organosiliconhydride polymers were deposited employing methylsilane as a precursor. Depositions were conducted at flow rates of 18 to 22 sccm methylsilane to give working pressures of 80 mTorr without rf power and up to 100 mTorr with rf power. A 13.56 MHz generator was tuned and adjusted so as to produce a faint but stable glow discharge confined to, but filling, the region just above the power electrode (occurring at a power setting of 6W, corresponding to a power density over the substrate area of 30 $mWcm^{-2}$). Films deposited in freshly cleaned chambers (those having been exposed to a discharge in oxygen and oxygen/Freon 12 mixtures) typically exhibited nonreproducible photoreactivity. The chamber was preconditioned by running at 24W rf power (120 $mWcm^{-2}$) for 15 minutes, followed by 6W for 15 minutes, after which the rf power was terminated and the reactor was then opened under a fast purge of dry nitrogen.

A 4" silicon wafer substrate coated with 1000 Å of aluminum was placed on the electrode and the chamber sealed and evacuated. Metering inlet valves were used to control flow rates and chamber pressure. A uniform film 1500±200 Å was deposited in 5 minutes, and films 4400±600 Å in thickness after 15 minutes. To demonstrate the utility of this process for integrated processing, the reactor was backfilled to about 200 torr of oxygen, and a simple wide line and space pattern was projected through a quartz lens window onto the substrate bearing the 1500 Å film.

The chamber was evacuated and then etching with $SiCl_4$ was performed to develop the image (100 mTorr pressure, 120 $mWcm^{-2}$ power incident on the sample). This procedure accomplished both resist development and etching through the aluminum to the silicon substrate. A 4400 Å thick film was removed from the reactor and exposed to 200 $mJcm^{-2}$ nominally 265 nm light on a 1000W ORIEL exposure system using a chromium on quartz contact print mask. Patterns were developed (as in Example 7) and transferred into the aluminum by chlorine reactive ion etching using a total pressure of 5 mTorr and flow rates of approximately 10 sccm, with a power density of 80 $mWcm^{-2}$ resulting in no measurable D.C. bias. After 15 minutes both the unexposed resist and 1000 Å of underlying aluminum were removed, while exposed regions retained 3500 Å of oxidized resist protecting the aluminum.

EXAMPLE 9

A PlasmaTherm ShuttleLock Series 750 plasma reactor, as described in Example 6, was employed for depositing a film at ambient temperature. The chamber was evacuated to a pressure of approximately $10^{-5}$ Torr, and a flow rate of 50 sccm of methylsilane and 50 sccm of hydrogen yielding a total pressure of approximately 400 mTorr was employed. A plasma was struck using 10±1W rf power. Three (A–C), 5" in diameter silicon (100) substrates, were subjected to this plasma. Additionally, three of such silicon wafers (D–F), previously coated with 0.7 μm of hard-baked Shipley resist 805, were subjected to the plasma and one wafer (G) coated with 3000 Å of polysilicon over a 100 Å gate oxide was also subjected to the plasma. The plasma was maintained for 3 minutes during which a faint glow was visible. The refractive index and the thickness of the deposited polymer film, as obtained from a nine-point measurement using a Nanometrics Nanoscope, averaged 1.72±0.03 and 1100±50 Å, respectively.

The substrates with their deposited resist material were stored and protected from exposure to ambient light and air until 5 minutes prior to patterning. Each of test samples A–C was imaged in air on a GCA XLS deep UV stepper (248 nm, 0.48 numerical aperture) using a resolution mask having a 5×5 matrix yielding 5 $mJ/cm^2$ steps of exposure from 5 to 120 $mJ/cm^2$. Samples D–F were imaged using the same resolution mask with exposure dose varying from 30 $mJ/cm^2$ to 55 $mJ/cm^2$ in steps of 5 $mJ/cm^2$.

The exposed wafers were immersed in a buffered solution of HF acid including seven parts of approximately 40% aqueous ammonium fluoride and one part of approximately 50% aqueous HF acid. As a result, the exposed areas were selectively removed. The wafers were then rinsed five times with deionized water and spun dry at 2000 rpm under partial vacuum (1 Torr) for 5 minutes.

Test samples A–C were immersed in the buffered HF acid developer for 1, 3, and 4 minutes, respectively. The average etch rate of the unexposed portions of the resist, as determined from thickness changes using ellipsometry, increased from approximately 15 Å per minute after 1 minute development to approximately 30 and 36 Å per minute after 3 and 4 minute development, respectively. The selectivity was approximately 10:1 at 50 $mJ/cm^2$ dose.

Test samples D–F were similarly developed using 5 minute immersions. In addition, samples E and F were subjected to 30 seconds of post-development broad band UV exposure in air using an Oriel Corporation exposure system having a 1000W high-pressure Hg-Xe ramp (estimated output in the 220–280 nm range of approximately 10 $mW/cm^{-2}$). Pattern transfer to the underlying organic layer was achieved by first using $Cl_2$ reactive ion etching preclean using a 100 cc chlorine flow yielding a 2 mTorr pressure with a 2500W source and 25W bias power at 25° C. in a Lucas Labs etcher with a Helicon high density plasma source. Etch time was 10 seconds for sample D and 25 seconds for samples E and F. The preclean was followed by an oxygen reactive ion etching treatment with an oxygen flow of 50 sccm yielding a partial pressure of 2 mTorr with a 2500W source and 100W bias power at 25° C. Etch time for samples D and F was 40 seconds including a 20% overetch. The patterns were examined by Scanning Electsode Microscopy and demonstrated equal line and space patterns to 0.25 µm in both dark and clear fields. Unoptimized exposure and focus latitude for 10% variation in coded linewidths of 0.30 µm and above were 35–50 mJ/cm² and 0.8–1 µm, respectively.

The test sample G was developed with buffered HF acid as described above and treated with subsequent UV flood exposure. Pattern transfer to a polysilicon layer using the above described chlorine reactive ion etching step for 80 seconds yielded 0.35 mm lines and space resolution.

EXAMPLE 10

A silicon-containing resist layer was deposited as described in Example 9 on a 0.6 µm thick organic underlayer as described in the previous example. However, the underlying organic layer was deposited by subjecting the silicon substrate to a plasma discharge struck in a 10 sccm flow of cycloheptatriene at a partial pressure of 100 mTorr using 60W of rf power at 25° C. for 10 minutes in a PlasmaLab diode reactor. The resist film was imaged at 248 nm as described for Sample E in Example 9. The resist was then patterned using a chlorine reactive ion etch as described for Sample E in Example 9, and the resulting pattern was transferred to the underlying organic layer using an oxygen reactive ion etch under conditions described for Sample E in Example 9.

EXAMPLE 11

Depositions were performed using a PlasmaTherm Model 700 deposition/etch system operating in etch mode, i.e., with the wafer placed on the lower RF powered electrode with the top showerhead electrode grounded. Films were deposited at RF powers of 20W, with methylsilane flow rates of 50 sccm and pressure controlled at 300 mTorr. The deposition rate under these conditions was ca. 280 Å/minute and the deposition was continued to obtain a thickness of 1400 Å.

Wafers used for bilevel pattering were precoated with 0.80µ of Shipley 1809 resist which was hardbaked at 250° C. for 2 minutes to render it insoluble, photostable, and unreactive. Plasma polymerized methylsilane was deposited as described above for 3.5 minutes to give films 950 Å thick as measured on bare silicon wafers. Wafers were exposed using a GCA 248 nm Deep UV stepper with exposure doses ranging between 10 and 200 mJ/cm² (in 10 mJ/cm² increments), either through a blank quartz mask or resolution test mask. All dry negative tone plasma development was performed using a two step timed etch procedure. The first step employed a Lucas Labs Helicon etching tool operating at 2 mTorr with 1000W source power and 25W chuck bias, using 30 sccm pure $Cl_2$. Etch time (ca. 50 sec) was selected to effect the removal of all silicon containing material in unexposed areas plus a 20% overetch (based on etch rate measurements on identically deposited unexposed films on bare silicon). Pattern transfer through the underlying organic layer was performed subsequently in the same chamber employing 50 sccm pure oxygen at 2.0 mTorr with a 2500W source power and a chuck power of 100W for 35 seconds. Top-down line width measurements on a Hitachi S-6000 (0.8 keV) scanning electron microscope were performed on patterned wafers developed by this procedure. Exposure dose latitudes providing features within 10% of coded dimensions for nested 0.25 line and space features were between 105 and 135 mJ/cm², with equivalent or larger latitudes and good linearity for larger features.

EXAMPLE 12

A procedure for positive tone bilevel processing using plasma polymerized methylsilane imaging layers deposited under conditions selected to increase stability to handling in air is described below. Depositions were performed using the Plasma Therm Model 700 deposition/etch system operating in etch mode, i.e., with the wafer placed on the lower RF powered electrode with the top showerhead electrode grounded. Films were deposited at RF powers of 20W, with methylsilane flow rates of 50 sccm and pressure controlled at 300 mTorr. Under these conditions, five-minute depositions onto single wafers centered on the lower electrode gave films with an initial thickness of 1400 Å and refractive index of 1.72.

Wafers used for bilevel patterning were precoated with 0.80µ of Shipley 1809 resin baked at 250° C. for 2 minutes, after which a five-minute deposition of plasma polymerized methylsilane was performed as described above. Wafers were exposed using a GCA 248 nm Deep UV stepper with exposure doses ranging between 10 and 200 mJ/cm² (in 10 mJ/cm² increments), either through a clear quartz mask blank or resolution test mask. Positive tone development was performed by submerging wafers in a room temperature bath of 7:1 $NH_4F$/HF buffered aqueous oxide etch solution for 5 minutes, after which films were rinsed with distilled water and spun dry under a purge of dry nitrogen at 50° C.

Figure 3:
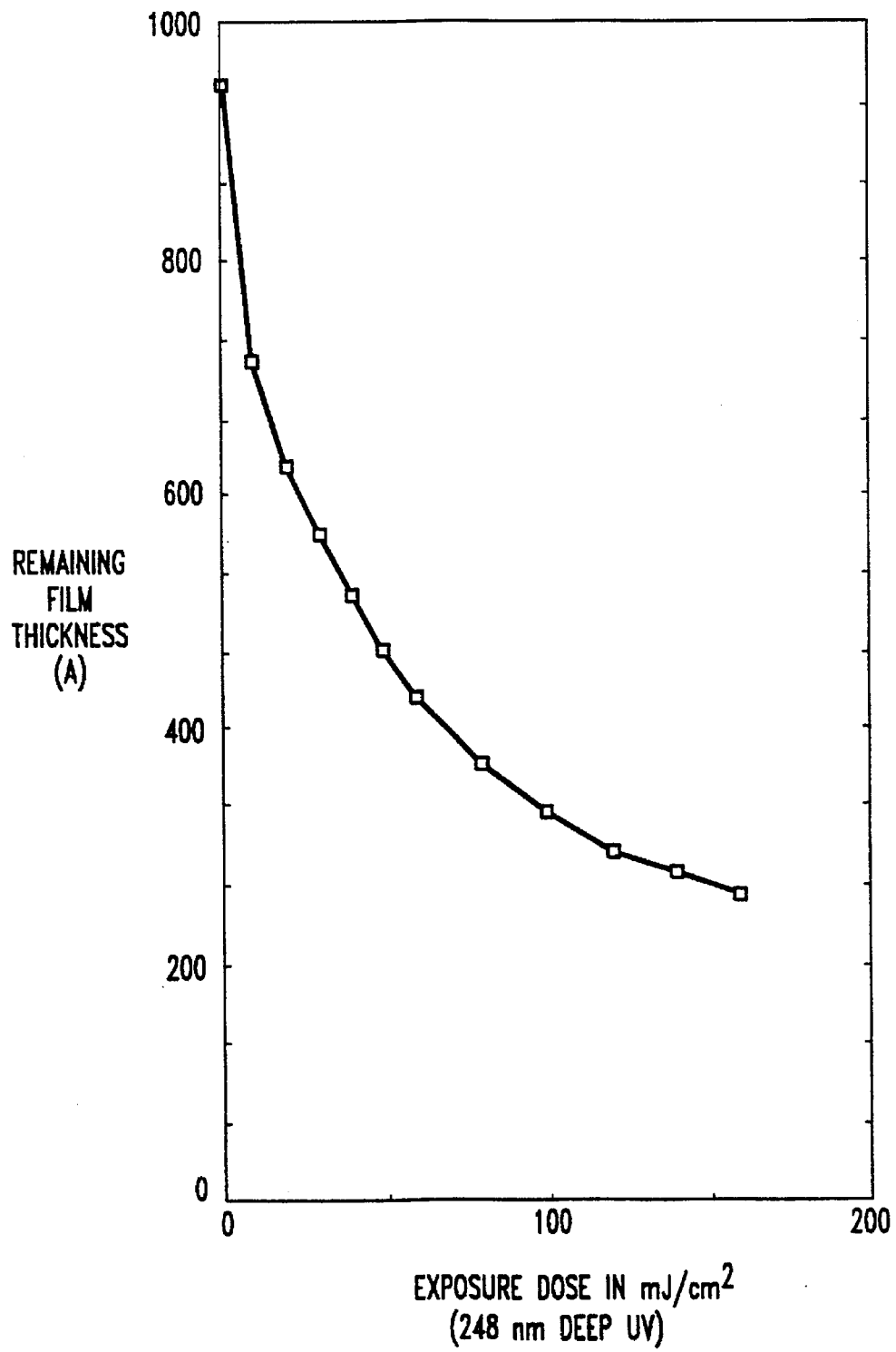
FIG. 3 is illustrative of properties associated with photosensitive material involved in the invention.

Films were then blanket exposed to deep UV light in air for one minute under a low pressure mercury vapor lamp (using an apparatus intended for UV-ozone resist stripping) at room temperature in air for one minute, which converted material remaining in both exposed and unexposed regions into a completely photooxidized form with a refractive index ca. 1.45. A plot of the film thickness in exposed areas as a function of exposure dose is given in FIG. 3. Development of bilevel patterns was performed using a two step timed etch procedure. The first step (essentially a plasma descure step) employed a mixture of $SF_6$ (26 sccm) and 6 sccm $O_2$ in a Lucas Labs Helicon etching tool operating at 2 mTorr with 2500W source power and 25W chuck bias. Based on etch rate measurements on identically treated, blanket UV exposed films on bare silicon, an etch time of 40 seconds was chosen to effect the uniform removal of 400 Å of material, an amount sufficient to uncover the underlying organic layer in exposed regions of the patterned substrates. Pattern transfer through the underlying organic layer was performed subsequently in the same chamber using 50 sccm pure oxygen at 2.0 mTorr at 2500W source power with a chuck power of 100W and etch time of 35 seconds. Top-down line width measurements on developed bilevel patterns were performed on a Hitachi S-6000 (0.8 keV) scanning electron microscope. Exposure dose latitudes providing features within 10% of coded dimensions for nested 0.25 line and space features were between 130 and 160 mJ/cm², with even wider latitudes and good linearity observed for larger sized features.

We claim:

1. A process for fabricating an article comprising the steps of forming a layer of radiation sensitive material on a substrate, exposing said material to said radiation to form a pattern and developing said pattern characterized in that said material comprises a silicon polymer represented by the base unit:

where $0.2<x<1.5$, $0.2<y<1.5$ and R is an organic substituent resulting in said material being insoluble and wherein said developed image is positive.

2. The process of claim 1 wherein said exposing said material is performed in the presence of oxygen.

3. The process of claim 1 wherein said therefore developed image is achieved by employing a plasma based etchant.

4. The process of claim 1 wherein said therefore developed image is achieved by employing a wet etchant.

5. The process of claim 1 wherein said radiation comprises ultraviolet or deep ultraviolet radiation.

6. The process of claim 1 wherein said organic substituent comprises an alkyl or an aryl substituent.

7. The process of claim 1 wherein said developing is accomplished with an aqueous developer.

8. The process of claim 1 wherein said pattern after said developing is further oxidized.

9. The process of claim 8 wherein said pattern is oxidized to $SiO_2$.

10. A process for fabricating a body comprising the steps of forming a layer of radiation sensitive material on a substrate, exposing said material to said radiation to form a pattern and developing said pattern characterized in that said material is formed by discharge in a precursor such that said material comprises a composition represented by the formula $[R_xSiH_y]$ where $0.2<x<1.5$, $0.2<y<1.5$ and R is an organic substituent and wherein said pattern is positive.

11. The process of claim 10 wherein said exposure is performed in the presence of oxygen.

12. The process of claim 10 wherein said development comprises exposure to a plasma.

13. The process of claim 12 wherein said plasma comprises a fluorine-containing plasma wherein the plasma is generated by striking a discharge in a gas comprising a fluorine-containing reactant selected from the group consisting of $CF_4$, $CHF_3$, and $SF_6$.

14. The process of claim 10 wherein said radiation comprises ultraviolet or deep ultraviolet light.

15. The process of claim 10 wherein said organic substituent comprises an alkyl or an aryl substituent.

16. The process of claim 10 including the step of transferring said pattern to said substrate by etching.

17. The process of claim 10 wherein said forming a layer is done in the presence of hydrogen.

18. The process of claim 10 wherein said developing said pattern comprises exposure to a wet etchant.

19. The process of claim 10 wherein said pattern after said developing is further oxidized.

20. A process for fabricating a body comprising the steps of forming a layer of radiation sensitive material on a substrate, exposing said material to said radiation to form a pattern and developing said pattern characterized in that said material is formed by discharge in a precursor comprising a composition represented by the formula $RSiH_3$ wherein R is an organic substituent and wherein said pattern is positive.

21. The process of claim 20 wherein said organic substituent comprises an alkyl or aryl substituent.

22. The process of claim 20 wherein said forming and said developing is performed without subjecting said substrate to the ambient environment.

23. The process of claim 20 wherein said pattern after said developing is further oxidized.

* * * * *